US012159961B2

(12) United States Patent
Navabi (10) Patent No.: US 12,159,961 B2
(45) Date of Patent: Dec. 3, 2024

(54) LIGHT EMITTING DIODE FOR LOW TEMPERATURE APPLICATIONS (71) Applicant: Abeyatech, LLC, Springfield, MO (US)

(72) Inventor: Aarash Navabi, Walpole, MA (US)

(73) Assignee: Azenta Life Sciences, Inc., Chelmsford, MA (US)

( * ) Notice: Subject to any disclaimer, the term of this patent is extended or adjusted under 35 U.S.C. 154(b) by 952 days.

(21) Appl. No.: 17/053,899

(22) PCT Filed: May 15, 2019

(86) PCT No.: PCT/US2019/032446
§ 371 (c)(1),
(2) Date: Nov. 9, 2020

(87) PCT Pub. No.: WO2019/226438
PCT Pub. Date: Nov. 28, 2019

(65) Prior Publication Data
US 2021/0135061 A1    May 6, 2021

Related U.S. Application Data (60) Provisional application No. 62/673,994, filed on May 20, 2018.

(51) Int. Cl.
H01L 33/48    (2010.01)
B23K 35/26    (2006.01)
(Continued)

(52) U.S. Cl.
CPC ............ H01L 33/486 (2013.01); B23K 35/26 (2013.01); H05K 1/181 (2013.01); H05K 3/3463 (2013.01);
(Continued)

(58) Field of Classification Search
None
See application file for complete search history.

(56) References Cited

U.S. PATENT DOCUMENTS

2011/0074031 A1* 3/2011 Zenner .................... H01L 24/05
438/654
2012/0307505 A1  12/2012 Chen
(Continued)

FOREIGN PATENT DOCUMENTS

CN    102255031 A    11/2011
CN    103430637 A    12/2013
(Continued)

OTHER PUBLICATIONS

"Table of Specialty Alloys and Solders", Oct. 9, 2004, pp. 2, 8 to 10, 12.
"Solder", Wikipedia, Feb. 23, 2013, pp. 8, 18, 22, 23.

Primary Examiner — Nilufa Rahim
(74) Attorney, Agent, or Firm — Sisson & Banyas, Attorneys at Law, LLC; Jeffrey J. Banyas (57) ABSTRACT It is described herein a light emitting diode (10) which may comprise a metal core printed circuit board (100), a mounting platform, and a thermal interface membrane located between the metal core printed circuit board and the mounting platform. The metal core printed circuit board may comprise at least one resistor (110), at least one lighting element (120), and at least one wire (130). The at least one resistor may be connected to the metal core printed circuit board by a first solder which is free of tin. The at least one wire may be connected to the metal core printed circuit board by a second solder which is free of tin. The at least one lighting element may be connected to the metal core printed circuit board by a third solder which is free of tin.

20 Claims, 6 Drawing Sheets (51) Int. Cl.
  *H05K 1/18*    (2006.01)
  *H05K 3/34*    (2006.01)

(52) U.S. Cl.
  CPC .............. *H05K 2201/10106* (2013.01); *H05K 2201/10287* (2013.01)

(56) References Cited

U.S. PATENT DOCUMENTS

| | | | |
|---|---|---|---|
| 2013/0050155 A1* | 2/2013 | Petersen | ............... B81B 7/0067 |
| | | | 345/204 |
| 2014/0061689 A1 | 3/2014 | Seibel | |
| 2016/0029485 A1* | 1/2016 | Dummer | .............. H05K 1/0295 |
| | | | 362/382 |
| 2018/0124926 A1* | 5/2018 | Modi | ..................... H05K 3/064 |
| 2019/0042000 A1* | 2/2019 | Kasmieh | ............... G06F 1/1684 |
| 2020/0344884 A1* | 10/2020 | Wu | ....................... H05K 1/036 |

FOREIGN PATENT DOCUMENTS

| | | |
|---|---|---|
| EP | 2096905 A1 | 9/2009 |
| FR | 2235752 A1 | 1/1975 |
| JP | 2004-528992 A | 9/2004 |
| JP | 2006-269756 A | 10/2006 |
| JP | 2011-222433 A | 11/2011 |
| KR | 10-2011-0066339 A | 6/2011 |
| WO | 2014/127594 A1 | 8/2014 |
| WO | 2014/200169 A1 | 12/2014 |

\* cited by examiner

LIGHT EMITTING DIODE FOR LOW TEMPERATURE APPLICATIONS

CROSS REFERENCES AND PRIORITIES

This Application claims priority from International Application No. PCT/US2019/032446 filed on 15 May 2019 and U.S. Provisional Application No. 62/673,994 filed on 20 May 2018, the teachings of each of which are incorporated herein by reference in their entirety.

BACKGROUND

Light emitting diodes, also known as LEDs, are used in a number of applications to provide illumination. In some instances, illumination is needed in environments subject to extreme cold temperatures below −50° C. Existing lighting elements, including light emitting diodes, suffer from many problems when operated in such extreme cold temperatures. In some instances the lighting element may not "heat up" to a temperature necessary to provide illumination, or may do so at a slow rate. In other instances, internal wiring within the lighting element may fail, resulting in a lighting element which does not illuminate at all.

Many solutions have been proposed for overcoming these common problems. However, it remained for the inventors to find the solutions described herein.

SUMMARY

Described herein is a light emitting diode comprising a metal core printed circuit board having an outer perimeter defining a first planar surface and a second planar surface opposite the first planar surface. The metal core printed circuit board may comprise at least one lighting element connected to the first planar surface. Each lighting element of the at least one lighting element may be connected to the first planar surface by a third solder which may be free of tin. The metal core printed circuit board may comprise at least one wire connected to the first planar surface. Each wire of the at least one wire may be connected to the first planar surface by a second solder which may be free of tin.

In some embodiments, the metal core printed circuit board may further comprise at least one resistor connected to the first planar surface by a first solder which may be free of tin.

In some embodiments, the first solder may consist of indium. In other embodiments the first solder may comprise indium.

In some embodiments where the first solder comprises indium, the first solder may comprise indium and silver. In such embodiments, silver may be present in the first solder at a level in a range of between 0.1% by weight and 10% by weight, indium may be present in the first solder at a level in a range of between 85% by weight and 99.8% by weight, and the silver and indium combined may account for 100% by weight of the first solder.

In other embodiments where the first solder comprises indium, the first solder may comprise indium and lead. In such embodiments, lead may be present in the first solder at a level in a range of between 40% by weight and 50% by weight, indium may be present in the first solder at a level in a range of between 50% by weight and 60% by weight, and the lead and indium combined may account for 100% by weight of the first solder.

In still other embodiments where the first solder comprises indium, the first solder may comprise indium, silver, and bismuth. In such embodiments, bismuth may be present in the first solder at a level in a range of between 0.1% by weight and 5% by weight, silver may be present in the first solder at a level in a range of between 0.1% by weight and 10% by weight, indium may be present in the first solder at a level in a range of between 85% by weight and 99.8% by weight, and the bismuth, silver, and indium combined may account for 100% by weight of the first solder.

In yet other embodiments where the first solder comprises indium, the first solder may comprise indium, silver, and gallium. In such embodiments, gallium may be present in the first solder at a level in a range of between 1% by weight and 6% by weight, silver may be present in the first solder at a level in a range of between 0.1% by weight and 10% by weight, indium may be present in the first solder at a level in a range of between 85% by weight and 99.8% by weight, and the gallium, silver, and indium combined may account for 100% by weight of the first solder.

In some embodiments, the second solder may consist of indium. In other embodiments the second solder may comprise indium.

In some embodiments where the second solder comprises indium, the second solder may comprise indium and silver. In such embodiments, silver may be present in the second solder at a level in a range of between 0.1% by weight and 10% by weight, indium may be present in the second solder at a level in a range of between 85% by weight and 99.8% by weight, and the silver and indium combined may account for 100% by weight of the second solder.

In other embodiments where the second solder comprises indium, the second solder may comprise indium and lead. In such embodiments, lead may be present in the second solder at a level in a range of between 40% by weight and 50% by weight, indium may be present in the second solder at a level in a range of between 50% by weight and 60% by weight, and the lead and indium combined may account for 100% by weight of the second solder.

In still other embodiments where the second solder comprises indium, the second solder may comprise indium, silver, and bismuth. In such embodiments, bismuth may be present in the second solder at a level in a range of between 0.1% by weight and 5% by weight, silver may be present in the second solder at a level in a range of between 0.1% by weight and 10% by weight, indium may be present in the second solder at a level in a range of between 85% by weight and 99.8% by weight, and the bismuth, silver, and indium combined may account for 100% by weight of the second solder.

In yet other embodiments where the second solder comprises indium, the second solder may comprise indium, silver, and gallium. In such embodiments, gallium may be present in the second solder at a level in a range of between 1% by weight and 6% by weight, silver may be present in the second solder at a level in a range of between 0.1% by weight and 10% by weight, indium may be present in the second solder at a level in a range of between 85% by weight and 99.8% by weight, and the gallium, silver, and indium combined may account for 100% by weight of the second solder.

In some embodiments, the third solder may consist of indium. In other embodiments the third solder may comprise indium.

In some embodiments where the third solder comprises indium, the third solder may comprise indium and silver. In such embodiments, silver may be present in the third solder at a level in a range of between 0.1% by weight and 10% by weight, indium may be present in the third solder at a level in a range of between 85% by weight and 99.8% by weight, and the silver and indium combined may account for 100% by weight of the third solder.

In other embodiments where the third solder comprises indium, the third solder may comprise indium and lead. In such embodiments, lead may be present in the third solder at a level in a range of between 40% by weight and 50% by weight, indium may be present in the third solder at a level in a range of between 50% by weight and 60% by weight, and the lead and indium combined may account for 100% by weight of the third solder.

In still other embodiments where the third solder comprises indium, the third solder may comprise indium, silver, and bismuth. In such embodiments, bismuth may be present in the third solder at a level in a range of between 0.1% by weight and 5% by weight, silver may be present in the third solder at a level in a range of between 0.1% by weight and 10% by weight, indium may be present in the third solder at a level in a range of between 85% by weight and 99.8% by weight, and the bismuth, silver, and indium combined may account for 100% by weight of the third solder.

In yet other embodiments where the third solder comprises indium, the third solder may comprise indium, silver, and gallium. In such embodiments, gallium may be present in the third solder at a level in a range of between 1% by weight and 6% by weight, silver may be present in the third solder at a level in a range of between 0.1% by weight and 10% by weight, indium may be present in the third solder at a level in a range of between 85% by weight and 99.8% by weight, and the gallium, silver, and indium combined may account for 100% by weight of the third solder.

In some embodiments, the light emitting diode may further comprise a lens. The lens may be connected to the metal core printed circuit board by a plurality of screws. The lens may be manufactured from a polycarbonate.

In some embodiments, the light emitting diode may further comprise a thermal interface membrane. The thermal interface membrane may be in contact with the second planar surface. The thermal interface membrane may have a thermal conductivity of at least 750 W/(m-K). The thermal interface membrane may be free of an adhesive. In some embodiments, the thermal interface membrane may comprise graphite. In other embodiments, the thermal interface membrane may comprise silver.

In some embodiments, the light emitting diode may further comprise a mounting platform. The metal core printed circuit board may be connected to the mounting platform by a plurality of screws. In some embodiments, the mounting platform may be a heat sinking platform. In other embodiments, the mounting platform may be a wall of a tank.

DETAILED DESCRIPTION

This specification is best understood by referring to the Figures which contain detailed drawings of embodiments of the invented light emitting diode. Reference will now be made to the various Figures in which, unless otherwise noted, like numbers refer to like structures. As described herein and in the claims, the following numbers refer to the following structures as noted in the Figures.

10 refers to a light emitting diode.
100 refers to a metal core printed circuit board.
110 refers to a resistor.
120 refers to a lighting element.
130 refers to a wire.
140 refers to an outer perimeter.
150 refers to a first planar surface.
160 refers to a second planar surface
170 refers to a plurality of holes.
200 refers to a mounting platform.
210 refers to a plurality of threaded holes.
300 refers to a thermal interface membrane.
400 refers to a screw.
500 refers to a lens.
510 refers to a plurality of lens holes.

Figure 1:
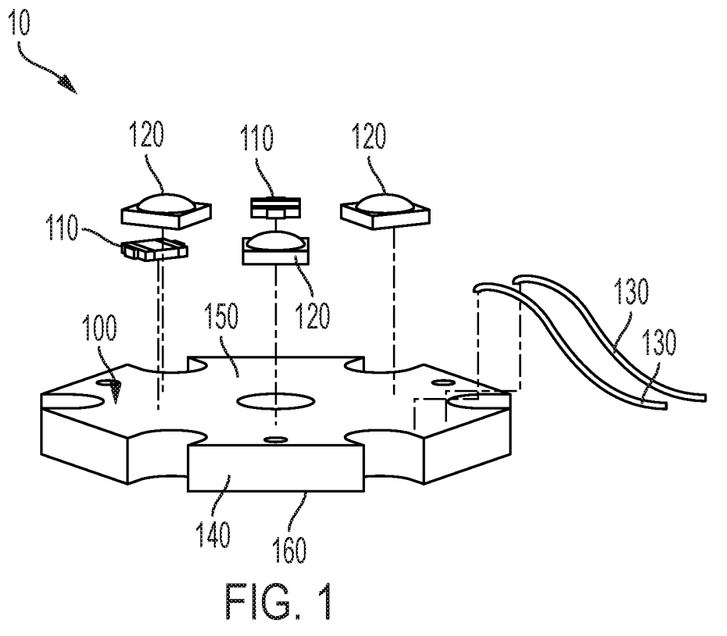
FIG. 1 depicts an exploded perspective view of an embodiment of a light emitting diode as described herein.

FIG. 1 depicts an exploded perspective view of a light emitting diode (10). As shown in FIG. 1, the light emitting diode may comprise a metal core printed circuit board (100). Connected to the metal core printed circuit board may be at least one wire (130) and at least one lighting element (120). In some embodiments, at least one optional resistor (110) may also be connected to the metal core printed circuit board. As further shown in FIG. 1, the metal core printed circuit board (100) comprises an outer perimeter (140) defining a first planar surface (150) and a second planar surface (160) opposite the first planar surface.

The metal core printed circuit board (100) may come in many sizes, shapes and configurations and may be of any type previously disclosed in the art and those yet to be invented. Certain metal core printed circuit boards may be encapsulated in a dielectric resin, although a dielectric resin encapsulation is not considered necessary. One example of a metal core printed circuit board is a SinkPAD™ printed circuit board available from ADURA LED Solutions of Corona, California, U.S.A.

As further shown in FIG. 1, the metal core printed circuit board (100) may optionally comprise at least one resistor (110). The at least one resistor may be connected to the metal core printed circuit board on the first planar surface (150) by a first solder. Preferably the first solder is free of tin or substantially free of tin. By substantially free of tin it is meant that the first solder comprises no more than trace amounts of tin defined as preferably less than 2.0% by weight tin in the first solder with less than 1.5% by weight tin in the first solder being more preferred, less than 1.0% by weight tin in the first solder being even more preferred, and less than 0.5% by weight tin in the first solder being most preferred. Without wishing to be bound to any theory, it is believed that these trace amounts are insufficient for the tin to express its metal characteristics when present in the metal alloy of the first solder. More preferably, the first solder comprises indium. Most preferably the first solder consists of indium, that is, the first solder is pure indium having less than 0.01% of an element which is not indium.

In some embodiments, the first solder may comprise elements other than indium. For example, the first solder may comprise indium and silver. In other embodiments, the first solder may comprise indium and lead. In still other embodiments, the first solder may comprise indium, silver, and bismuth. In yet other embodiments, the first solder may comprise indium, silver, and gallium.

Where the first solder comprises indium and silver, the level of indium and silver may each be expressed as a range based on the total weight percent of the first solder. In a preferred embodiment, silver is present in the first solder at a level in a range of between 0.1% by weight and 10% by weight while indium is present in the first solder at a level in a range of between 85% by weight and 99.8% by weight with the silver and indium combined to account for 100% by weight of the first solder. One of ordinary skill will recognize that the weight percentages disclosed herein and in the claims represent weight percentages of the various elements in the composition that forms the first solder.

Where the first solder comprises indium and lead, the level of indium and lead may each be expressed as a range based on the total weight percent of the first solder. In a preferred embodiment, lead is present in the first solder at a level in a range of between 40% by weight and 50% by weight while indium is present in the first solder at a level in a range of between 50% by weight and 60% by weight with the lead and indium combined to account for 100% by weight of the first solder. One of ordinary skill will recognize that the weight percentages disclosed herein and in the claims represent weight percentages of the various elements in the composition that forms the first solder.

Where the first solder comprises indium, silver, and bismuth, the level of indium, silver, and bismuth may each be expressed as a range based on the total weight percent of the first solder. In a preferred embodiment, bismuth is present in the first solder at a level in a range of between 0.1% by weight and 5% by weight, silver is present in the first solder at a level in a range of between 0.1% by weight and 10% by weight, and indium is present in the first solder at a level in a range of between 85% by weight and 99.8% by weigh with the bismuth, silver, and indium combined to account for 100% by weight of the first solder. One of ordinary skill will recognize that the weight percentages disclosed herein and in the claims represent weight percentages of the various elements in the composition that forms the first solder.

Where the first solder comprises indium, silver, and gallium, the level of indium, silver, and gallium may each be expressed as a range based on the total weight percent of the first solder. In a preferred embodiment, gallium is present in the first solder at a level in a range of between 1% by weight and 6% by weight, silver is present in the first solder at a level in a range of between 0.1% by weight and 10% by weight, and indium is present in the first solder at a level in a range of between 85% by weight and 99.8% by weight with the gallium, silver, and indium combined to account for 100% by weight of the first solder. One of ordinary skill will recognize that the weight percentages disclosed herein and in the claims represent weight percentages of the various elements in the composition that forms the first solder.

The number and location of optional resistor(s) is not considered important and will vary depending upon a number of factors. While the example shown in the Figures comprises three resistors, embodiments may exist which have more or less than three resistors. For example, the metal core printed circuit board (100) may comprise at least two resistors, at least three resistors, at least four resistors, or at least five resistors. Each resistor may have one or more leads. The resistors, when used, limit the current flowing from the wire(s) to the lighting element(s).

As further shown in FIG. 1, the metal core printed circuit board (100) may comprise at least one wire (130). The at least one wire may be connected to the metal core printed circuit board on the first planar surface (150) by a second solder. Preferably, the second solder is free of tin or substantially free of tin. By substantially free of tin it is meant that the second solder comprises no more than trace amounts of tin defined as preferably less than 2.0% by weight tin in the second solder with less than 1.5% by weight tin in the second solder being more preferred, less than 1.0% by weight tin in the second solder being even more preferred, and less than 0.5% by weight tin in the second solder being most preferred. Without wishing to be bound to any theory, it is believed that these trace amounts are insufficient for the tin to express its metal characteristics when present in the metal alloy of the second solder. More preferably, the second solder comprises indium. Most preferably the second solder consists of indium, that is, the second solder is pure indium having less than 0.01% of an element which is not indium.

In some embodiments, the second solder may comprise elements other than indium. For example, the second solder may comprise indium and silver. In other embodiments, the second solder may comprise indium and lead. In still other embodiments, the second solder may comprise indium, silver, and bismuth. In yet other embodiments, the second solder may comprise indium, silver, and gallium.

Where the second solder comprises indium and silver, the level of indium and silver may each be expressed as a range based on the total weight percent of the second solder. In a preferred embodiment, silver is present in the second solder at a level in a range of between 0.1% by weight and 10% by weight while indium is present in the second solder at a level in a range of between 85% by weight and 99.8% by weight with the silver and indium combined to account for 100% by weight of the second solder. One of ordinary skill will recognize that the weight percentages disclosed herein and in the claims represent weight percentages of the various elements in the composition that forms the second solder.

Where the second solder comprises indium and lead, the level of indium and lead may each be expressed as a range based on the total weight percent of the second solder. In a preferred embodiment, lead is present in the second solder at a level in a range of between 40% by weight and 50% by weight while indium is present in the second solder at a level in a range of between 50% by weight and 60% by weight with the lead and indium combined to account for 100% by weight of the second solder. One of ordinary skill will recognize that the weight percentages disclosed herein and in the claims represent weight percentages of the various elements in the composition that forms the second solder.

Where the second solder comprises indium, silver, and bismuth, the level of indium, silver, and bismuth may each be expressed as a range based on the total weight percent of the second solder. In a preferred embodiment, bismuth is present in the second solder at a level in a range of between 0.1% by weight and 5% by weight, silver is present in the second solder at a level in a range of between 0.1% by weight and 10% by weight, indium is present in the second solder at a level in a range of between 85% by weight and 99.8% by weight, and the bismuth, silver, and indium combined account for 100% by weight of the second solder. One of ordinary skill will recognize that the weight percentages disclosed herein and in the claims represent weight percentages of the various elements in the composition that forms the second solder.

Where the second solder comprises indium, silver, and gallium, the level of indium, silver, and gallium may each be expressed as a range based on the total weight percent of the second solder. In a preferred embodiment, gallium is present in the second solder at a level in a range of between 1% by weight and 6% by weight, silver is present in the second solder at a level in a range of between 0.1% by weight and 10% by weight, and indium is present in the second solder at a level in a range of between 85% by weight and 99.8% by weight with the gallium, silver, and indium combined to account for 100% by weight of the second solder. One of ordinary skill will recognize that the weight percentages disclosed herein and in the claims represent weight percentages of the various elements in the composition that forms the second solder.

The number and location of wires is not considered important and will depend upon a variety of factors. While the examples shown in the Figures comprise two wires, embodiments may exist which have more or less than two wires. For example, the metal core printed circuit board (100) may comprise at least two wires, at least three wires, at least four wires, or at least five wires. The wires are used to transfer electricity generated from a source outside of the light emitting diode, such as a battery or an electrical grid, to the metal core printed circuit board.

As further shown in FIG. 1, the metal core printed circuit board may further comprise at least one lighting element (120). The lighting element(s) may be connected to the metal core printed circuit board on the first planar surface (150) by a third solder. Preferably, the third solder is free of tin or substantially free of tin. By substantially free of tin it is meant that the third solder comprises no more than trace amounts of tin defined as preferably less than 2.0% by weight tin in the third solder with less than 1.5% by weight tin in the third solder being more preferred, less than 1.0% by weight tin in the third solder being even more preferred, and less than 0.5% by weight tin in the third solder being most preferred. Without wishing to be bound to any theory, it is believed that these trace amounts are insufficient for the tin to express its metal characteristics when present in the metal alloy of the third solder. More preferably, the third solder comprises indium. Most preferably the third solder consists of indium, that is, the third solder is pure indium having less than 0.01% of an element which is not indium.

In some embodiments, the third solder may comprise elements other than indium. For example, the third solder may comprise indium and silver. In other embodiments, the third solder may comprise indium and lead. In still other embodiments, the third solder may comprise indium, silver, and bismuth. In yet other embodiments, the third solder may comprise indium, silver, and gallium.

Where the third solder comprises indium and silver, the level of indium and silver may each be expressed as a range based on the total weight percent of the third solder. In a preferred embodiment, silver is present in the third solder at a level in a range of between 0.1% by weight and 10% by weight while indium is present in the third solder at a level in a range of between 85% by weight and 99.8% by weight with the silver and indium combined to account for 100% by weight of the third solder. One of ordinary skill will recognize that the weight percentages disclosed herein and in the claims represent weight percentages of the various elements in the composition that forms the third solder.

Where the third solder comprises indium and lead, the level of indium and lead may each be expressed as a range based on the total weight percent of the third solder. In a preferred embodiment, lead is present in the third solder at a level in a range of between 40% by weight and 50% by weight while indium is present in the third solder at a level in a range of between 50% by weight and 60% by weight with the lead and indium combined to account for 100% by weight of the third solder. One of ordinary skill will recognize that the weight percentages disclosed herein and in the claims represent weight percentages of the various elements in the composition that forms the third solder.

Where the third solder comprises indium, silver, and bismuth, the level of indium, silver, and bismuth may each be expressed as a range based on the total weight percent of the third solder. In a preferred embodiment, bismuth is present in the third solder at a level in a range of between 0.1% by weight and 5% by weight, silver is present in the third solder at a level in a range of between 0.1% by weight and 10% by weight, and indium is present in the third solder at a level in a range of between 85% by weight and 99.8% by weigh with the bismuth, silver, and indium combined to account for 100% by weight of the third solder. One of ordinary skill will recognize that the weight percentages disclosed herein and in the claims represent weight percentages of the various elements in the composition that forms the third solder.

Where the third solder comprises indium, silver, and gallium, the level of indium, silver, and gallium may each be expressed as a range based on the total weight percent of the third solder. In a preferred embodiment, gallium is present in the third solder at a level in a range of between 1% by weight and 6% by weight, silver is present in the third solder at a level in a range of between 0.1% by weight and 10% by weight, and indium is present in the third solder at a level in a range of between 85% by weight and 99.8% by weight with the gallium, silver, and indium combined to account for 100% by weight of the third solder. One of ordinary skill will recognize that the weight percentages disclosed herein and in the claims represent weight percentages of the various elements in the composition that forms the third solder.

The number and location of lighting element(s) is not considered important and will vary depending upon a number of factors. While the example shown in the Figures comprises three lighting elements, embodiments may exist which have more or less than three lighting elements. For example, the metal core printed circuit board (100) may comprise at least two lighting elements, at least three lighting elements, at least four lighting elements, or at least five lighting elements. The lighting elements produce light when they receive an electrical current which passes from a source outside of the light emitting diode, such as a battery or an electrical grid, through the wire(s) into the metal core printed circuit board (and optionally through the resistor(s)) and to the lighting element(s).

Figure 2:
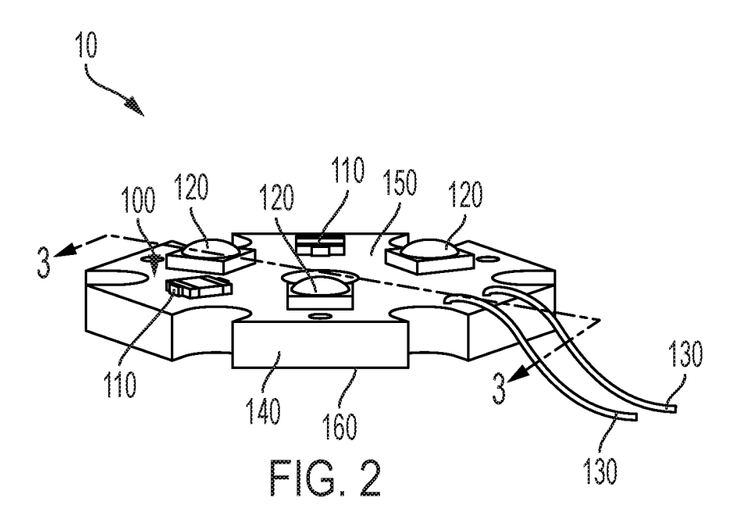
FIG. 2 depicts an assembled perspective view of the embodiment of a light emitting diode of FIG. 1.

FIG. 2 depicts an assembled perspective view of the embodiment of a light emitting diode (10) shown in FIG. 1. FIG. 2 shows the optional resistors (110), the wires (130), and the lighting elements (120) connected to the first planar surface (150) of the metal core printed circuit board (100).

Figure 3:
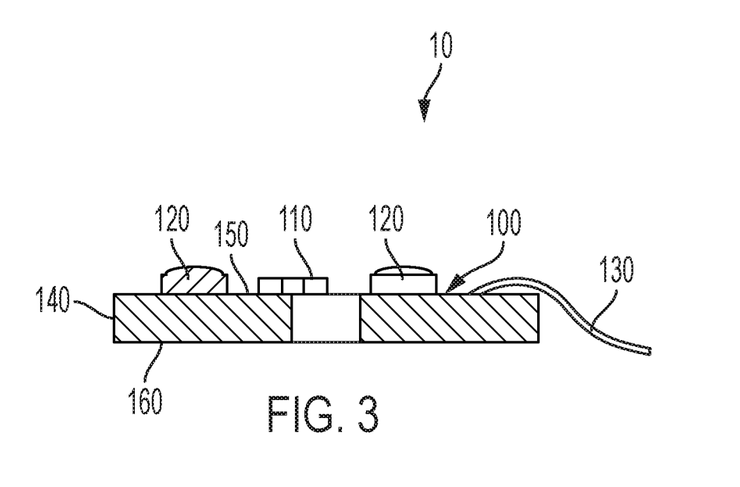
FIG. 3 depicts a cross section view of the embodiment of a light emitting diode of FIG. 2.

FIG. 3 depicts a cross section view of the embodiment of a light emitting diode (10) shown in FIG. 2. As shown in FIG. 3, each of the optional resistors (110) may be connected to the first planar surface (150) of the metal core printed circuit board (100) by the first solder. FIG. 3 also shows each of the wires (130) connected to the first planar surface of the metal core printed circuit board by the second solder.

Finally, FIG. 3 shows the lighting element (120) connected to the first planar surface of the metal core printed circuit board by the third solder.

Figure 4:
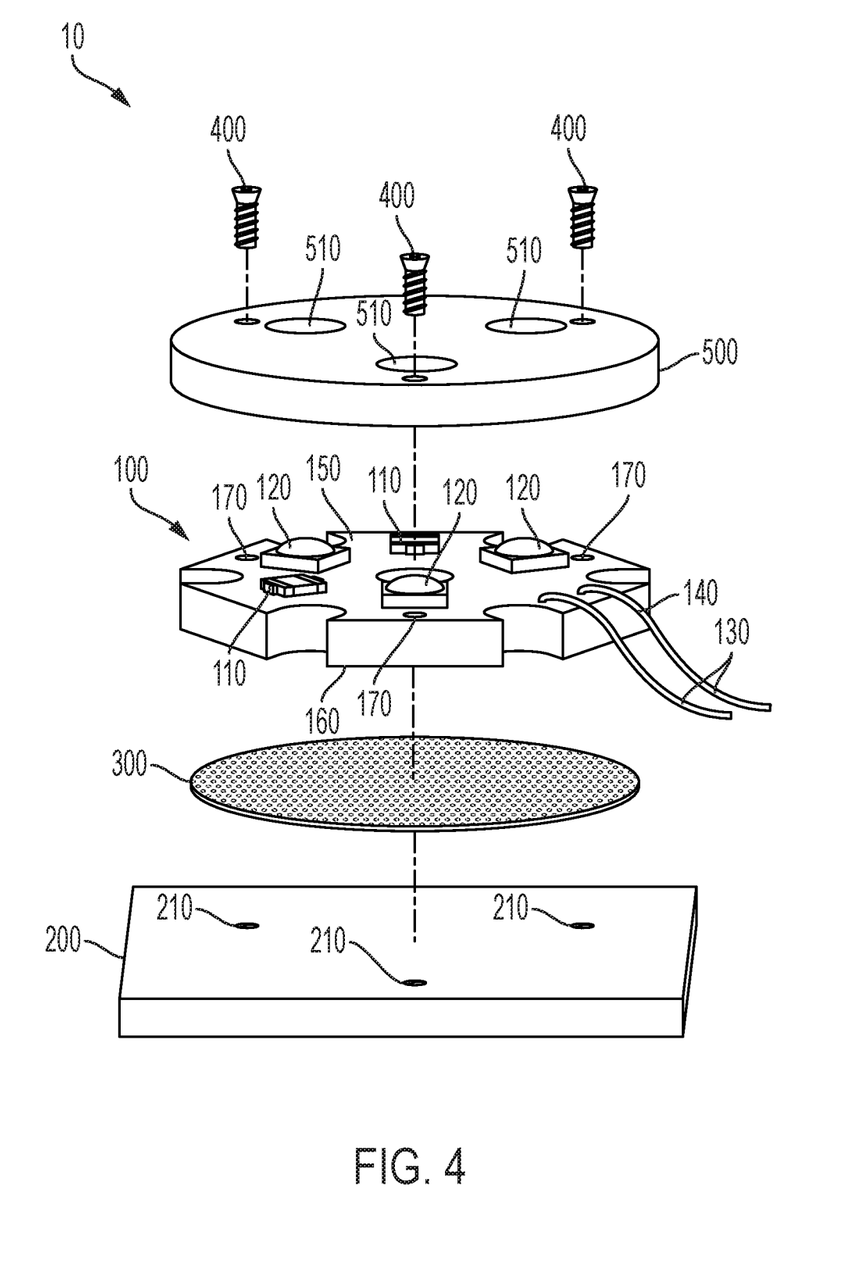
FIG. 4 depicts an exploded perspective view of an embodiment of a light emitting diode as described herein.

FIG. 4 depicts an exploded perspective view of a light emitting diode (10). As shown in FIG. 4, the light emitting diode may comprise the metal core printed circuit board (100), a mounting platform (200), and a thermal interface membrane (300). The thermal interface membrane, when present, is preferably located between the metal core printed circuit board and the mounting platform. The metal core printed circuit board may be connected to the mounting platform by a plurality of screws (400), each of which passes through one of a plurality of holes (170) located in the metal core printed circuit board and threads into a corresponding threaded hole of a plurality of threaded holes (210) located in the mounting platform. The number of holes and number of threaded holes is not considered important and will depend upon a variety of factors including the size and configuration of the light emitting diode.

FIG. 4 also depicts the light emitting diode having an optional lens (500). When present, the optional lens may be connected to the metal core printed circuit board by the plurality of screws (400) each of which passes through one of a plurality of lens holes (510) located in the lens and threads into a corresponding hole of a plurality of holes (170) located in the metal core printed circuit board. The plurality of screws which connect the optional lens to the metal core printed circuit board may be the same as or different than the plurality of screws that connects the metal core printed circuit board to the optional mounting platform (200). When the plurality of screws which connect the optional lens to the metal core printed circuit board are the same as the plurality of screws that connect the metal core printed circuit board to the optional mounting platform, each screw of the plurality of screws will pass through one of the plurality of holes in the metal core printed circuit board, and thread into one of the threaded holes of the plurality of threaded holes (210) located in the mounting platform. One of ordinary skill will recognize that the plurality of screws may be replaced by a plurality of other fasteners such as bolts, rivets, and the like. The lens, when present, may be manufactured from a polycarbonate material.

In some embodiments, the mounting platform (200)—when present—may be a heat sinking platform. A heat sinking platform is defined as a surface through which heat generated by one or more components of the light emitting diode is transferred. Preferably the heat sinking platform is a metal surface having a thermal conductivity. Preferably, the thermal conductivity of the heat sinking platform will be in a range selected from the group consisting of between 6 W/(m-K) and 450 W/(m-K), between 6 W/(m-K) and 300 W/(m-K), between 6 W/(m-K) and 200 W/(m-K), and between 6 W/(m-K) and 100 W/(m-K). The heat sinking platform, when used, directs heat away from the metal core printed circuit board (100), most preferably away from the lighting element (120). Alternatively, the mounting platform may be a wall of a tank, such as a tank used for cryogenic storage. One such cryogenic storage tank is disclosed in U.S. Provisional Application No. 62/673,995 and U.S. Provisional Application No. 62/795,340, the teachings of each of which are incorporated herein by reference in their entirety. Preferably the wall of the tank is an internal wall of the tank providing a light source for a viewer to see the internal contents of the tank.

The thermal interface membrane (300), when present, will be in contact with the second planar surface (160). The thermal interface membrane may comprise a number of different materials. In one example, the thermal interface membrane comprises graphite. In another example, the thermal interface membrane comprises silver. Preferably, the thermal interface membrane is free of an adhesive. The thermal interface membrane, when present, is not required to have any particular size, shape, thickness, or location. However, it is preferred that the thermal interface membrane have a size and shape identical to or substantially similar to the size and shape of the bottom surface of the lighting element (120). In such embodiments, it is preferred that at least one thermal interface membrane is located adjacent to the second planar surface (160) of the metal core printed circuit board opposite the location of the lighting element on the first planar surface (150) of the metal core printed circuit board.

The thermal interface membrane (300), when present, may also be defined with respect to its properties. For instance, the thermal interface membrane will have a thermal conductivity. Preferably, the thermal conductivity will be at least 750 W/(m-K) with at least 1,000 W/(m-K) being more preferred and at least 1,250 W/(m-K) being still more preferred. By having a thermal conductivity in the above ranges, it is thought that the thermal interface membrane more rapidly directs heat away from the metal core printed circuit board during operation, which can help extend the life of the metal core printed circuit board.

Figure 5:
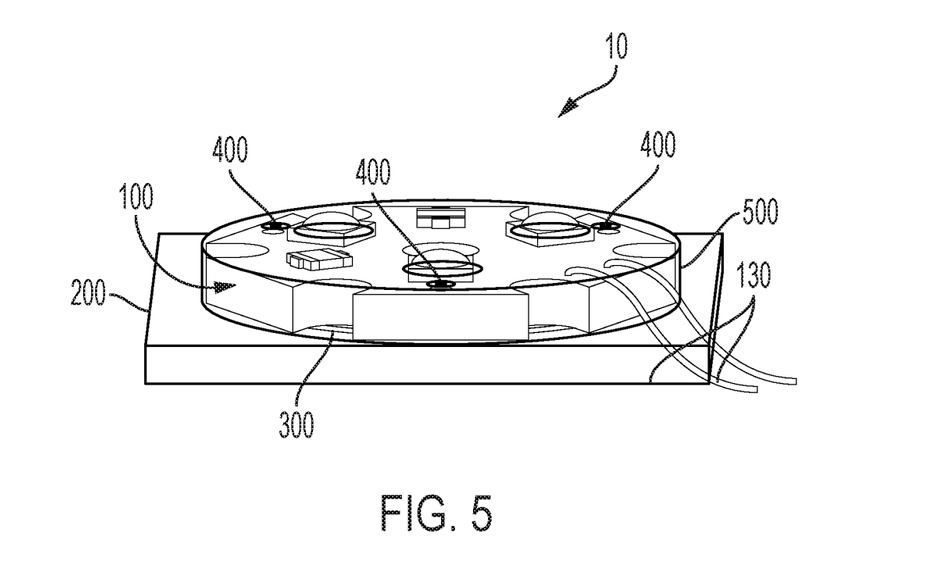
FIG. 5 depicts an assembled perspective view of the embodiment of a light emitting diode of FIG. 4.

FIG. 5 depicts an assembled perspective view of the light emitting diode (10) shown in FIG. 4. As shown in FIG. 5, in some embodiments, the metal core printed circuit board (100) is connected to the optional mounting platform (200) and the optional lens (500) by passing each screw of the plurality of screws (400) through a corresponding hole in the optional lens, the metal core printed circuit board, and into the optional mounting platform. One of ordinary skill will recognize that, in embodiments having an optional lens but no optional mounting platform, each screw of the plurality of screws may pass through a corresponding hole in the lens and into the metal core printed circuit board. One of ordinary skill will also recognize that, in embodiments having an optional mounting platform but no optional lens, each screw of the plurality of screws may pass through a corresponding hole in the metal core printed circuit board and into the optional mounting platform.

Figure 6:
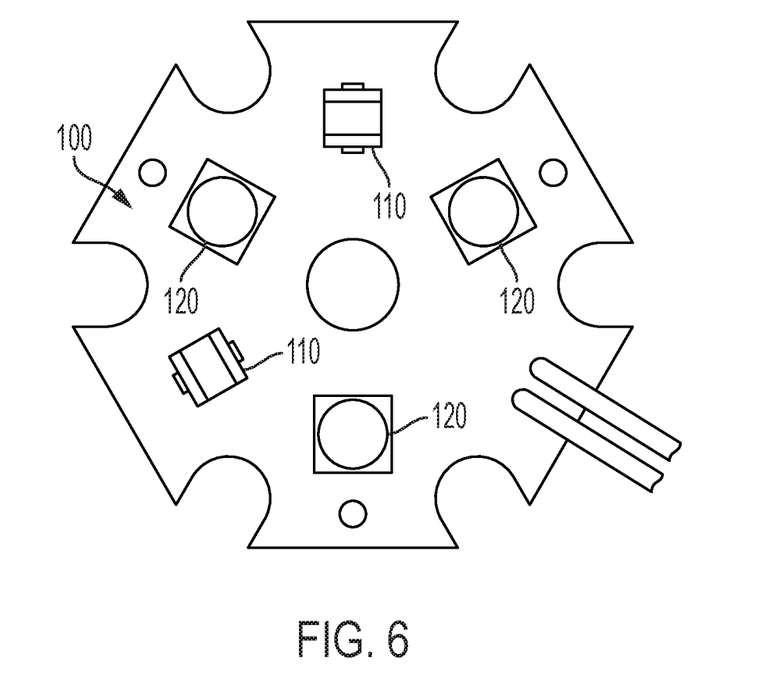
FIG. 6 depicts a top view of a metal core printed circuit board for a light emitting diode as described herein.

FIG. 6 depicts a top view of a metal core printed circuit board. As shown in FIG. 6, the metal core printed circuit board comprises at least one optional resistor (110). The metal core printed circuit board further comprises at least one lighting element (120).

The inventors surprisingly discovered that the light emitting diode is capable of withstanding reduced cryogenic temperatures at or below −180° C. without components of the light emitting diode such as the resistors, the wires, or the light source, separating from the metal core printed circuit board. Without wishing to be bound by any theory, it is believed that the mechanical properties of the various components of the solders disclosed herein prevent cracking or disintegration of the connections between the metal core printed circuit board and the resistors, wires, and light source.

The inventors also surprisingly discovered that the thermal interface membrane reduces aging of the metal core printed circuit board caused by rapid temperature changes as the light emitting diode is turned on and off. It was found that traditional methods of reducing aging, such as the use of thermal pastes, were unable to reduce aging of the metal core printed circuit board when the light emitting diode was utilized in a cryogenic environment at temperatures at or below −180° C. Without wishing to be bound by any theory, it is believed that the liquid components which make up all or a portion of the thermal paste solidify, crack, and/or disintegrate in the cryogenic environments whereas the thermal interface membranes disclosed herein remain intact.

What is claimed is:

1. A light emitting diode comprising:
a metal core printed circuit board (100) having an outer perimeter (140) defining a first planar surface (150) and a second planar surface (160) opposite the first planar surface, said metal core printed circuit board comprising at least one lighting element (120) connected to the first planar surface, and at least one wire (130) connected to the first planar surface; and
wherein the at least one wire is configured to transfer electricity generated from a source outside the light emitting diode to the metal core printed circuit board, each wire of the at least one wire is connected to the first planar surface by a second solder which is free of tin, and each lighting element of the at least one lighting element is connected to the first planar surface by a third solder which is free of tin.

2. The light emitting diode of claim 1, further comprising at least one resistor (110) connected to the first planar surface by a first solder which is free of tin.

3. The light emitting diode of claim 2, wherein the first solder comprises indium.

4. The light emitting diode of claim 2, wherein the first solder comprises indium and at least one metal selected from the group consisting of silver, lead, bismuth, and gallium.

5. The light emitting diode of claim 4, wherein silver is present in the first solder at a level in a range of between 0.1% by weight and 10% by weight, indium is present in the first solder at a level in a range of between 85% by weight and 99.8% by weight, and the silver and indium combined account for 100% by weight of the first solder.

6. The light emitting diode of claim 4, wherein lead is present in the first solder at a level in a range of between 40% by weight and 50% by weight, indium is present in the first solder at a level in a range of between 50% by weight and 60% by weight, and the lead and indium combined account for 100% by weight of the first solder.

7. The light emitting diode of claim 1, wherein the second solder comprises indium.

8. The light emitting diode of claim 1, wherein the second solder comprises indium and at least one metal selected from the group consisting of silver, lead, bismuth, and gallium.

9. The light emitting diode of claim 8, wherein silver is present in the second solder at a level in a range of between 0.1% by weight and 10% by weight, indium is present in the second solder at a level in a range of between 85% by weight and 99.8% by weight, and the silver and indium combined account for 100% by weight of the second solder.

10. The light emitting diode of claim 8, wherein lead is present in the second solder at a level in a range of between 40% by weight and 50% by weight, indium is present in the second solder at a level in a range of between 50% by weight and 60% by weight, and the lead and indium combined account for 100% by weight of the second solder.

11. The light emitting diode of claim 1, wherein the third solder comprises indium.

12. The light emitting diode of claim 1, wherein the third solder comprises indium and at least one metal selected from the group consisting of silver, lead, bismuth, and gallium.

13. The light emitting diode of claim 12, wherein silver is present in the third solder at a level in a range of between 0.1% by weight and 10% by weight, indium is present in the third solder at a level in a range of between 85% by weight and 99.8% by weight, and the silver and indium combined account for 100% by weight of the third solder.

14. The light emitting diode of claim 12, wherein lead is present in the third solder at a level in a range of between 40% by weight and 50% by weight, indium is present in the third solder at a level in a range of between 50% by weight and 60% by weight, and the lead and indium combined account for 100% by weight of the third solder.

15. The light emitting diode of claim 1, further comprising a thermal interface membrane (300) in contact with the second planar surface.

16. The light emitting diode of claim 15, wherein the thermal interface membrane has a thermal conductivity of at least 750 W/(m-K).

17. The light emitting diode of claim 15, wherein the thermal interface membrane is free of an adhesive.

18. The light emitting diode of claim 15, wherein the thermal interface membrane comprises graphite.

19. The light emitting diode of claim 15, wherein the thermal interface membrane comprises silver.

20. The light emitting diode of claim 1, further comprising a mounting platform (200) wherein the metal core printed circuit board is connected to the mounting platform by a plurality of screws (400).

* * * * *